(12) United States Patent
Oh et al.

(10) Patent No.: US 11,251,318 B2
(45) Date of Patent: Feb. 15, 2022

(54) EFFICIENT BLACK SILICON PHOTOVOLTAIC DEVICES WITH ENHANCED BLUE RESPONSE

(75) Inventors: Jihun Oh, Golden, CO (US); Howard M. Branz, Golden, CO (US); Hao-Chih Yuan, Conifer, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 532 days.

(21) Appl. No.: 14/002,950

(22) PCT Filed: Mar. 8, 2011

(86) PCT No.: PCT/US2011/027479
§ 371 (c)(1),
(2), (4) Date: Sep. 3, 2013

(87) PCT Pub. No.: WO2012/121706
PCT Pub. Date: Sep. 13, 2012

(65) Prior Publication Data
US 2013/0340824 A1    Dec. 26, 2013

(51) Int. Cl.
*H01L 31/0216* (2014.01)
*H01L 31/0236* (2006.01)
(Continued)

(52) U.S. Cl.
CPC .... *H01L 31/02168* (2013.01); *H01L 31/0284* (2013.01); *H01L 31/02363* (2013.01);
(Continued)

(58) Field of Classification Search
CPC ........... H01L 31/02168; H01L 31/0236; H01L 31/02363; H01L 31/0284; H01L 31/1868;
(Continued)

(56) References Cited

U.S. PATENT DOCUMENTS 3,874,956 A    4/1975  Gamo et al.
4,111,762 A    9/1978  Wade et al.
(Continued)

FOREIGN PATENT DOCUMENTS

CN    101916787    10/2010
JP    S629681 A    1/1987
(Continued)

OTHER PUBLICATIONS

Knotter, D., et al., "Silicon Surface Roughening Mechanisms in Ammonia Hydrogen Peroxide Mixtures", Journal of The Electrochemical Society, vol. 147, Issue 2, 2000, pp. 736-740.
(Continued)

*Primary Examiner* — Eli S Mekhlin
(74) *Attorney, Agent, or Firm* — Sam J. Barkley; Paul J. White; John C. Stolpa

(57) ABSTRACT

A photovoltaic (PV) device with improved blue response. The PV device includes a silicon substrate with an emitter layer on a light receiving side. The emitter layer has a low opant level such that it has sheet resistance of 90 to 170 ohm/sq. Anti-reflection in the PV device is provided solely by a nano-structured or black silicon surface on the light-receiving surface, through which the emitter is formed by diffusion. The nano structures of the black silicon are formed in a manner that does not result in gold or another high-recombination metal being left in the black silicon such as with metal-assisted etching using silver. The black silicon is further processed to widen these pores so as to provide larger nanostructures with lateral dimensions in the range of 65 to 150 nanometers so as to reduce surface area and also to etch away a highly doped portion of the emitter.

11 Claims, 7 Drawing Sheets

(51) Int. Cl.
*H01L 31/028* (2006.01)
*H01L 31/18* (2006.01)

(52) U.S. Cl.
CPC .......... *H01L 31/1868* (2013.01); *Y02E 10/50* (2013.01); *Y02P 70/50* (2015.11)

(58) Field of Classification Search
CPC . H01L 21/306; H01L 21/30604; Y02E 10/50; Y02E 10/545–548
USPC ................... 136/252, 255, 256, 261; 216/99
See application file for complete search history.

(56) References Cited

U.S. PATENT DOCUMENTS

| | | | |
|---|---|---|---|
| 4,960,177 | A | 10/1990 | Holm-Kennedy et al. |
| 5,196,088 | A | 3/1993 | Soda |
| 5,250,460 | A | 10/1993 | Yamagata et al. |
| 5,264,375 | A | 11/1993 | Bang et al. |
| 6,091,021 | A | 7/2000 | Ruby et al. |
| 6,093,941 | A | 7/2000 | Russell et al. |
| 6,178,033 | B1 | 1/2001 | Ford et al. |
| 6,284,317 | B1 | 9/2001 | Laibinis et al. |
| 6,329,296 | B1 | 12/2001 | Ruby et al. |
| 6,383,936 | B1 | 5/2002 | Tsai et al. |
| 6,538,801 | B2 | 3/2003 | Jacobson et al. |
| 6,721,083 | B2 | 4/2004 | Jacobson et al. |
| 6,759,313 | B2 | 7/2004 | Yamakazi et al. |
| 6,762,134 | B2 | 7/2004 | Bohn et al. |
| 6,790,785 | B1 | 9/2004 | Li et al. |
| 6,899,816 | B2 | 5/2005 | Padhi et al. |
| 6,905,622 | B2 | 6/2005 | Padhi et al. |
| 7,052,587 | B2 | 5/2006 | Gibson et al. |
| 7,090,783 | B1 | 8/2006 | Cui et al. |
| 7,135,414 | B2 | 11/2006 | Matsumura et al. |
| 7,141,490 | B2 | 11/2006 | Yamakazi et al. |
| 7,476,573 | B2 | 1/2009 | Cohen |
| 7,585,786 | B2 | 9/2009 | Goo et al. |
| 7,718,254 | B2 | 5/2010 | Matsumura et al. |
| 7,833,391 | B2 | 11/2010 | Fan et al. |
| 8,053,270 | B2 | 11/2011 | Dimitrov et al. |
| 8,053,328 | B2 | 11/2011 | Cohen |
| 8,075,792 | B1 | 12/2011 | Branz et al. |
| 8,119,438 | B2 | 2/2012 | Nishimoto |
| 8,124,535 | B2 | 2/2012 | Lin et al. |
| 8,193,095 | B2 | 6/2012 | Lin et al. |
| 8,334,216 | B2 | 12/2012 | Lin et al. |
| 8,486,843 | B2 | 7/2013 | Li et al. |
| 2002/0068421 | A1 | 6/2002 | Yamakazi et al. |
| 2002/0104552 | A1 | 8/2002 | Bay |
| 2002/0123227 | A1 | 9/2002 | Winningham et al. |
| 2002/0145792 | A1 | 10/2002 | Jacobson et al. |
| 2003/0096113 | A1 | 5/2003 | Jacobson et al. |
| 2003/0119332 | A1 | 6/2003 | Kuebelbeck et al. |
| 2003/0190812 | A1 | 10/2003 | Padhi et al. |
| 2004/0100594 | A1 | 5/2004 | Huibers et al. |
| 2004/0100677 | A1 | 5/2004 | Huibers et al. |
| 2004/0112426 | A1* | 6/2004 | Hagino ........... H01L 31/022425 136/261 |
| 2004/0241967 | A1 | 12/2004 | Yamakazi et al. |
| 2005/0056118 | A1 | 3/2005 | Xia et al. |
| 2005/0101153 | A1 | 5/2005 | Matsumura et al. |
| 2005/0130439 | A1 | 6/2005 | Goo et al. |
| 2005/0137531 | A1 | 6/2005 | Prausnitz et al. |
| 2005/0271805 | A1 | 12/2005 | Kambe et al. |
| 2006/0281333 | A1 | 12/2006 | Shin et al. |
| 2006/0281334 | A1 | 12/2006 | Shin et al. |
| 2007/0121205 | A1 | 5/2007 | Miles |
| 2007/0148922 | A1 | 6/2007 | Yamakazi et al. |
| 2007/0152234 | A1 | 7/2007 | Yamamoto et al. |
| 2007/0155021 | A1 | 7/2007 | Zhang et al. |
| 2007/0155022 | A1 | 7/2007 | Yamakawa et al. |
| 2007/0184576 | A1 | 8/2007 | Chang et al. |
| 2007/0190326 | A1 | 8/2007 | Perry et al. |
| 2007/0206267 | A1 | 9/2007 | Tung et al. |
| 2007/0247620 | A1 | 10/2007 | Koo |
| 2007/0281249 | A1 | 12/2007 | Tutt et al. |
| 2008/0090074 | A1 | 4/2008 | Matsumura et al. |
| 2009/0020158 | A1* | 1/2009 | Ohtsuka ............. H01L 21/2254 136/261 |
| 2009/0026070 | A1 | 1/2009 | Fan et al. |
| 2009/0107545 | A1 | 4/2009 | Moslehi |
| 2009/0147167 | A1 | 6/2009 | Park |
| 2009/0183776 | A1 | 7/2009 | Kwag et al. |
| 2009/0236317 | A1* | 9/2009 | Yost ................... H01L 31/0236 216/99 |
| 2009/0293946 | A1 | 12/2009 | Lin et al. |
| 2009/0308450 | A1* | 12/2009 | Adibi ................... H01L 21/266 136/256 |
| 2009/0317934 | A1 | 12/2009 | Scherff et al. |
| 2010/0029034 | A1 | 2/2010 | Nishimoto |
| 2010/0092888 | A1 | 4/2010 | Buchine et al. |
| 2010/0139763 | A1 | 6/2010 | Van Nieuwenhuysen et al. |
| 2010/0165336 | A1 | 7/2010 | Ebstein |
| 2010/0187123 | A1 | 7/2010 | Boscarsly et al. |
| 2010/0248449 | A1 | 9/2010 | Hildreth et al. |
| 2010/0258177 | A1 | 10/2010 | Ko et al. |
| 2010/0270263 | A1 | 10/2010 | Li et al. |
| 2010/0270650 | A1 | 10/2010 | Li et al. |
| 2010/0296986 | A1 | 11/2010 | Feyh |
| 2011/0003465 | A1 | 1/2011 | Scardera et al. |
| 2011/0030610 | A1 | 2/2011 | Kamian et al. |
| 2011/0045627 | A1 | 2/2011 | Sachs et al. |
| 2011/0143484 | A1 | 6/2011 | Lin et al. |
| 2011/0240997 | A1 | 10/2011 | Rockenberger et al. |
| 2011/0303265 | A1 | 12/2011 | Yuan et al. |
| 2011/0316134 | A1 | 12/2011 | Tsao et al. |
| 2011/0316145 | A1 | 12/2011 | Lin et al. |
| 2012/0024365 | A1 | 2/2012 | Branz et al. |
| 2012/0088372 | A1 | 4/2012 | Chien et al. |
| 2012/0103825 | A1 | 5/2012 | Oh et al. |
| 2012/0178204 | A1 | 7/2012 | Toor et al. |
| 2012/0225517 | A1 | 9/2012 | Zhang et al. |
| 2013/0052762 | A1 | 2/2013 | Li et al. |
| 2013/0095596 | A1* | 4/2013 | Fray ........................ C25B 1/006 438/71 |
| 2013/0234072 | A1 | 9/2013 | Yost et al. |

FOREIGN PATENT DOCUMENTS

| | | |
|---|---|---|
| JP | H06104463 A | 4/1994 |
| JP | H06169097 A | 6/1994 |
| JP | 2000261008 | 9/2000 |
| JP | 2000263556 | 9/2000 |
| JP | 2005277208 | 6/2005 |
| JP | 2005183505 | 7/2005 |
| JP | 2007305748 | 11/2007 |
| JP | 2008155472 | 7/2008 |
| JP | 2008197216 | 8/2008 |
| JP | 2009209420 | 9/2009 |
| JP | 2010527163 | 8/2010 |
| WO | WO 2002/031892 A1 | 4/2002 |
| WO | 2003105209 | 12/2003 |
| WO | 2005059985 | 6/2005 |
| WO | 2006051727 | 5/2006 |
| WO | 2007083152 | 7/2007 |
| WO | 2007025536 | 8/2007 |
| WO | WO 2009/054076 A1 | 4/2009 |
| WO | 2009117642 | 9/2009 |
| WO | 2011060193 | 5/2011 |
| WO | 2011161479 | 12/2011 |
| WO | WO-2011161479 A1 * | 12/2011 ............. C25B 1/006 |
| WO | 2012121706 | 9/2012 |
| WO | 2013142122 | 9/2013 |

OTHER PUBLICATIONS

Fukui et al., "Surface texturing using reactive ion etching for multicrystalline silicon solar cells," Conference Record of the 26th IEEE Photovoltaic Specialists Conference, Sep. 29-Oct. 3, 1997, Anaheim, CA, pp. 47-50.

(56) References Cited

OTHER PUBLICATIONS

Martin-Palma et al., "Antireflective porous-silicon coatings for multicrystalline solar cells: the effects of chemical etching and rapid thermal processing," Semiconductor Science and Technology, vol. 16, No. 8, Aug. 1, 2001, pp. 657-661.
Strehlke et al., "Oxidised Porous Silicon Surface Layers on a n+ Emitter," 2nd World Conference on Photovoltaic Solar Energy Conversion/ 15th European PV Solar Energy Conference/ 27th US IEEE Photovoltaics Specialists Conference/ 10th Asia/Pacific PV Science and Engineering Conference, Jul. 6-10, 1998, Vienna, Austria, pp. 1634-1637.
Bilyalov et al., "Multicrystalline silicon solar cells with porous silicon emitter," Solar Energy Materials and Solar Cells, vol. 60, Issue 4, Feb. 1, 2000, pp. 391-420.
Dekkers et al., "Reactive Ion Etched (RIE) Surface Texture for Light Trapping on Thin Film Solar Cells," 17th E.C. Photovoltaic Solar Energy Conference, Oct. 22-26, 2001, Munich, Germany, pp. 1678-1681.
European Patent Application No. EP11860252 Extended European Search Report dated Jul. 7, 2014.
Branz et al., "Nanostructured Black Silicon and the Optical Reflectance of Graded-Density Surfaces," Applied Physics Letters vol. 94, Issue 23, Jun. 2009, pp. 231121 (1-3).
Yuan,et al., "Efficient Black Sikocon Solar Cell With a Density-Graded Nanoporous Surface; Optical Properties, Performance Limitations, and Design Rules," Applied Physics Letters vol. 95, Issue 12, Sep. 2009, pp. 123501 (1-3).
Toor et al.,"Multi-Surface Texture to Improve Blue Response of Nanoporous Black Silicon Solar Cells," Applied Physics Letters vol. 99, Issue 10, Sep. 2011, pp. 10103501 (1-3).
Lee, et al., "Extremely Superhydrophobic Surfaces With Micro- and Nanostructures Fabricated by Copper Catalytice Etching," Langmuir Article, vol. 27, Issue 2, Jan. 18, 2011, pp. 809-814.
Huang et al., "Metal-Assited Electrochemical Etching of Silicon," Nanotechnology, vol. 21, Nov. 19, 2010 pp. 465301 (1-6).
Peng et al., "Fabrication of Single-Crystalline Silicon Nanowires y Scratching a Silicon Surface With Catalytic Metal Particles," Advanced Functional Materials, vol. 16, Issue 3, Feb. 2006, pp. 387-394.
Lee et al., "Patterning of Various Silicon Structures Via Polymer Lithography and Catalytic Chemical Etching," Nanotechnology, vol. 22, Issue 27, Jul. 8, 2011, pp. 275305 (1-6).
Liu et al., "Efficient SERS Substrates Made By Electroless Silver Deposition Into Patterned Silicon Structures," Journal of Material Chemistry, vol. 14, Issue 10, Apr. 21, 2004 (1st published on line), pp. 1526-1532.
Tsujino et al., "Texturization of Multicyrstalline Silicon Wafers For Solar Cells By Chemical Treatment Using Metallic Catalyst," Solar Energy Materials & Solar Cells, vol. 90, Issue 1, Jan. 2006, pp. 100-110.
Li et al., "Metal-Assisted Chemical Etching in HF/H2O2 Procedures Porous Silicon," Applied Physics Letters vol. 77, Issue16, Oct. 2000, pp. 2573-2574.
Nishioka et al., "Antireflection Subwavelength Structure of Silicon Surface Formed by Wet Process Using Catalysis of Single Nano-sized Gold Particle," Solar Energy Materials and Solar Cells, vol. 92, Issue 8, Aug. 2008, pp. 919-922.
Putnam et al., "10um minority-carrier diffusion lengths in Si Wires snythesized by Cu-catalyzed vapor-liquid-solid growth," Applied Physics Letters, vol. 95, Issue 16, Oct. 19, 2009, pp. 163116-1-163116-3.
Kuzuma-Filipek et al., ">16% thin-film epitaxial silicon solar cells on 70-cm2 area with 30-us active layer, porous silicon back reflector, and Cu-based top-contact metallization," Progress in Photovoltaics: research and applications, vol. 20, Issue 3, May 2012, pp. 350-355.
Nishioka et al., "Nano-sized Taper Structure Formed by Wet Process Using Catalysis of God Nanoparticle," School of Material Science, Japan Advanced Institute of Science and Technology, MRS Fall Meeting 2007.
Koynov et al., "Black multi-crystalline silicon solar cells," Rapid Research Letters, vol. 1, Issue 2, Oct. 2006, pp. R53-R55.
Koynov et al, "Black nonreflecting silicon surfaces for solar cells," Applied Physics Letter, vol. 88, Issue 30, May 2006, pp. 203107-1-203107-3.
Kumaravelu et al., "Surface Texturing for Silicon Solar Cells Using Reactive Ion Etching Technique," Photovoltaic Specialist Conference, 29th IEEE, May 19-24, 2002, pp. 258-261.
PCT/US09/37776 International Search Report and Written Opinion dated Sep. 28, 2009.
PCT/US09/37776 International Preliminary Report on Patentability dated Sep. 21, 2010.
PCT/US13/30257 International Search Report and Written Opinion dated May 16, 2013.
Japanese Application No. 500974/2011 Office Action dated Mar. 13, 2012 with English translation.
Chinese Application No. 200980110274.3 Office Action dated Dec. 25, 2012 with English translation.
Chinese Application No. 200980110274.3 Office Action dated Jun. 27, 2013 with English translation.
Chinese Application No. 200980110274.3 Office Action dated Jul. 10, 2012 with English translation.
Chinese Application No. 200980110274.3 Office Action dated Dec. 23, 2011 with English translation.
Menna et al, "Porous silicon in solar cells: A review and a description of its application as an AR coating," Solar Energy Materials and Solar Cells, vol. 37, Issue 1, Apr. 1995, pp. 13-24.
Li, et al, "Hydrogen generation from photoelectrochemical water splitting based on nanomaterials," Laser Photonics Rev. vol. 4, Issue 4, Jun. 2010, pp. 517-528.
Sai, et al., "Wide-Angle Antireflection Effect of Subwavelength Structures for Solar Cells," Japan Journal of Applied Physics, vol. 46, No. 6A, Jun. 2007, pp. 3333-3336.
Stephens, "Optical Reflectance and Transmission of a Textured Surface," Thin Solid Films, vol. 45, Issue 1, Aug. 1977, pp. 19-29.
Yu, "Fabrication of large area subwavelength antireflection structures on Si using trilayer resist nanoimprint lithography and liftoff," J. Vac. Sci. Technol. B 21, 2874, Dec. 2003.
Chartier et al, "Metal-assisted chemical etching of silicon in HF-H202," Electrochimica Acta, vol. 53, Issue 17, Jul. 2008, pp. 5509-5516.
Kelly, et al, "Design and characterization of a robust photoelectrochemical device to generate hydrogen using solar water splitting," Intl Journal of Hydrogen Energy, vol. 31, Issue 12, Sep. 2006, pp. 1658-1673.
Koshida, et al, "Photoelectrochemical Behavior of n-Type Porous-Si Electrodes," Japanese Journal of Applied Physics, 25, No. 7, Jul. 1986, pp. 1069-1072.
PCT/US10/56417 International Search Report and Written Opinion dated Jan. 25, 2011.
Xiu et al., "Superhydrophobic and Low Light Reflectivity Silicon Surfaces Fabricated by Hierarchical Etching," Langmuir vol. 24, Issue 18, Sep. 16, 2008, pp. 10421-10426.
Yoo et al., "Black silicon layer formation form application in solar cells," Solar Energy Materials & Solar Cells, vol. 90, Issues 18-19, Nov. 23, 2006, pp. 3085-3093.
U.S. Appl. No. 13/825,541 Restriction Requirement dated Oct. 11, 2013.
U.S. Appl. No. 12/053,444 Non Final Office Action dated Sep. 16, 2011.
U.S. Appl. No. 12/053,444 Non Final Office Action dated Apr. 4, 2012.
U.S. Appl. No. 12/053,444 Non Final Office Action dated Nov. 26, 2012.
U.S. Appl. No. 12/053,444 Final Office Action dated Jun. 6, 2013.
PCT/US2011/027479 ISR and Written Opinion dated Jun. 11, 2011.
PCT/US2011/027479 International Preliminary Report on Patentability dated Sep. 10, 2013.
Japanese Application No. 2013-111962 Office Action dated Jan. 7, 2014.
Japanese Application No. 2013-111962 Office Action dated Jan. 7, 2014 English Translation.

(56) References Cited

OTHER PUBLICATIONS

Kim, D., et al., "Structural and optical features of nanoporous silicon prepared by electrochemical anodic etching", Applied Surface Science, vol. 230, Issues 1-4, May 2004, pp. 125-130.
Bastide et al., "Chemical etching of Si by Ag nanocatalysts in $HF-H_2O_2$: application to multicrystalline Si solar cell texturization," Phys. Status Solidi C 6, No. 7, 2009, pp. 1536-1540.
Communication pursuant to Article 94(3) EPC, dated Sep. 7, 2018; 6 pages.

* cited by examiner

EFFICIENT BLACK SILICON PHOTOVOLTAIC DEVICES WITH ENHANCED BLUE RESPONSE

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Despite numerous attempts at making better solar cells with new and exotic materials, the photovoltaics market is still dominated by silicon wafer-based solar cells. Most solar cell manufacturers are equipped to produce silicon wafer-based solar cells, and research continues to design silicon-based solar cells that can achieve higher conversion efficiencies without an exorbitant increase in production costs. The aim of research often is to achieve solar cell designs with the lowest cost per watt generated by the solar cell, and, concurrently, the designs should provide solar cells that are suitable for inexpensive commercial production. The field of silicon solar cells appears to be moving toward application of thin silicon wafers, exfoliated or shaped silicon (Si) layers on inexpensive handle substrates, and films of crystal Si on inexpensive substrates. In addition to use in solar cells, silicon wafers, other silicon layers on substrates, and objects having silicon surfaces are used in numerous other applications such as in detectors, electronic devices, telecommunication devices, charge-coupled imaging devices (CCDs), computers, and even in biological or medical applications (together considered "photovoltaic devices").

The performance of solar cells and other optoelectronic devices is directly related to optical losses caused by high reflectivity. Flat silicon surfaces such as those found on an untreated silicon wafer have a high natural reflectivity of about thirty percent across the entire range of the solar spectrum that results in losses of light that could otherwise be converted to electrical energy by the silicon photovoltaic device. To produce high efficiency solar cells, researchers have sought ways to minimize reflection losses. One common approach has been to provide anti-reflection (AR) coatings that typically are selected based on their ability to provide destructive interference between light reflected from sharp top and bottom materials interfaces. For example, one-layer, quarter wavelength, nearly-transparent layers of materials such as $SiO_x$, $TiO_x$, ZnO, ITO, MgO, or $Si_3N_4$ are used at specific thicknesses as AR coatings on conventionally formed flat or planar silicon surfaces. Such AR coatings are resonant structures and perform well only in a limited spectral range and for specific angles of incidence while the solar spectrum spans a wide range of wavelengths and the incident angle varies during the day. The typical results achieved with simple one-layer AR coatings have been a reduction of the planar silicon surface reflection to about 8 to 15 percent. With more complex two-layer AR coatings or by combining a quarter-wave coating with micron scale surface texturing (for example pyramidal texture etched into the silicon surface), the reflectivity can be reduced to about 3 to 7 percent, but this kind of coating is expensive to apply and is limited in performance for light incident on the silicon surface at off-normal angles and also in diffuse light.

More recently, researchers determined that a graded density layer with lateral dimensions on the nanometer scale may be utilized to control reflectivity of silicon surfaces. Specifically, highly non-reflective or "black" silicon surfaces have been formed by researchers on silicon layers using a variety of methods, and the black silicon surface or layer may be thought of as a porous layer having a depth up to several microns or more that provides a density that is graded with depth, homogeneous in the lateral dimension, that reduces reflectivity and can take the place of conventional AR coatings. In one example, the black silicon or graded density layer is formed by texturing the planar surface of a silicon layer or substrate. In this representative example, an etching process provides molecular or ionic species containing a catalytic metal, such as gold, in the etching solution along with oxidant-etchant solution components, such as an etching agent, and an oxidizing agent. The catalytic metal molecule or ion acts to catalyze the reaction caused in part by the oxidant-etchant solution (e.g., HF and $H_2O_2$). The resulting etching is very uniform and produces a rapid formation of a non-reflective or black surface layer on the silicon surface or wafer that has a graded density or that is porous.

As a result of this or another black silicon forming process, a density-graded surface is provided that includes structures that have low porosity near the bulk material but that gradually change to high porosity near the material-air surface (e.g., upper hundred of nanometers or few microns of the silicon material or layer of the solar cell or other silicon-based device). In testing, such density-graded surfaces have proven to reduce reflective losses from a silicon surface to below two percent, or even below one percent, across the useful solar spectrum, and the anti-reflective function is achieved over a wide range of incident angles. In other approaches, such black silicon forming processes can produce Si pillars or wire-like structures protruding from the Si surface to reduce reflective losses equally well. Such structures can be formed, for example, by illumination with pulses from a femtosecond laser in a reactive gas or by vapor-liquid-solid crystal growth in silane, assisted by metals crystallation catalysts.

It will be appreciated that low surface reflectance (R) is needed in solar cells, detectors, and other photovoltaic devices to maximize the number of incident photons absorbed by the semiconductor that converts light to electrical energy. Surface reflectance is normally reduced in crystal silicon and other solar cells by providing a quarter-wavelength AR coating(s) over the top surface of the semiconductor (or silicon substrate). Such AR coatings function by destruction interference of reflected waves, and, therefore, normally have a narrow acceptance angle for anti-reflectance at a given wavelength. A density-graded surface layer or black silicon layer can also suppress surface reflection and may be used to replace conventional AR coatings as it is less expensive to manufacture and provides enhanced AR functionality (e.g., often less than 1 to 3 percent surface reflectance and comparable reflectance over a wide range of incident light angles).

Nanostructured or black silicon has interested researchers for use in photovoltaic devices because it provides excellent optical properties, such as broadband anti-reflection without the need for any heterogeneous coatings, that are desirable in and can be used in photovoltaic devices with significant economic benefit. However, when black silicon has been used in solar cells, for example, the tested performance has been lower than typically demanded for commercial applications, e.g., 18 to 20 percent or higher efficiencies are desirable.

For example, solar cells were fabricated with a silicon surface etched to provide columnar or pillar nanostructures with diameters ranging from 50 to 100 nanometers, but the solar cells had efficiencies of less than 12 percent. Other researchers attempted to provide black silicon solar cells with enhanced efficiencies, and solar cells were fabricated with metal-assisted etching with gold to provide a porous black silicon surface with pores or tunnels having diameters less than 60 nanometers (i.e., these researchers indicated that lateral structures should have smaller dimensions than the prior black silicon solar cells). These researchers were able to produce a 16.8 percent silicon solar cell, which represents a large improvement over the prior efforts. However, industry-wide adoption of solar cells fabricated with a black silicon layer to provide anti-reflection is not likely to occur until efficiencies are improved so as to approach or surpass those achieved with conventional AR coatings.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

The above-described and other reported black silicon solar cells apparently have a zone of high photocarrier recombination throughout the density-graded surface. This high photocarrier recombination layer limits the open-circuit voltage by causing photocarrier recombination. The high recombination layer further reduces short-circuit current, especially by reducing the collection of photocarriers generated by the blue and green parts of the solar spectrum, e.g., 350 to 700 nanometer wavelength photons (usually termed "blue response" for the color of light that is in this part of the solar spectrum). Absorption of these blue and green photons occurs within the black silicon layer, and high recombination of created minority-type photocarriers prevents their collection through the circuit and reduces the current produced by the solar cell. This loss of blue response is one of the primary causes of the low efficiencies found in previous solar cells using black silicon anti-reflection in place of anti-reflection coatings.

It was recognized that higher efficiency photovoltaic devices such as solar cells could be provided through the use of black silicon as the AR layer/element if efficiency of incident photons to electrical current could be improved for light with shorter wavelengths (e.g., better blue response). With this in mind, the following description teaches an efficient nanostructured silicon solar cell (or other photovoltaic device) with excellent spectral response at short wavelengths including blue light. By implementing the described techniques, a solar cell was fabricated with 18.2 percent efficiency (or an 18.2% cell), which represents nearly a 10 percent increase in efficiency over the very best of the prior black silicon solar cells. The solar cell had internal quantum efficiency (IQE) above 70 percent for 400 nanometer (nm) wavelength light, indicating that much of the increase in cell efficiency was achieved by fabricating the solar cell for better spectral response at short wavelengths.

From the description, it will become clear that efficiency of black silicon photovoltaic devices can be improved by implementing design parameters. First, Auger recombination in the black silicon emitter may be controlled or reduced by minimizing or at least reducing the volume and doping of the highly doped emitter region (e.g., by limiting the maximum concentration to less than $3\times10^{21}$ cm$^{-3}$ dopants while maintaining the doping desired for an effective carrier collecting emitter of more than about $10^{18}$ cm$^{-3}$ dopants that will also result in a high $V_{oc}$ from the solar cell). The doping profile of the emitter, for example, may be reduced to provide sheet resistance in the emitter in the range of 90 to 160 ohms-per-square (ohm/sq) when measured on the black silicon emitter. Such a sheet resistance indicates a process to produce reduced doping compared to industry standard solar cells that typically have emitter sheet resistances of about 50 ohm/sq.

Second, the nanostructures of the black silicon surface or layer may be formed so as to have feature sizes of 50 to 200 nm or, more typically, 65 to 150 nm (e.g., hole/pore diameters or pillar/column outer base diameters of more than about 65 nm in black silicon). With such lateral dimensions, the black silicon has significantly reduced surface area that may produce surface recombination, while still being configured to avoid substantial light back scattering that may increase the reflectivity.

Third, the nanoporous or black silicon layer may be formed so as to be free of high-recombination metals such as gold. In one embodiment, for example, the black silicon was formed without the use of gold by using metal-assisted etching using silver, and the presence of silver in the black silicon layer did not appear to significantly reduce efficiencies (e.g., presence of silver in the black silicon at levels below about $10^{19}$ cm$^{-3}$ may be acceptable according to this description). In some embodiments, photovoltaic devices are provided that utilize two of these design parameters while others make use of all three. For example, a device may have an emitter with higher resistance (e.g., reduced volume and doping of the emitter silicon material) and black silicon with larger lateral dimensions (e.g., hole or columns with diameters over 65 nm or the like), while other devices will also be fabricated free of gold or other high-recombination metals.

More particularly, a photovoltaic (PV) device is provided with efficiency increased by providing improved blue response. The PV device (such as a solar cell, detector, or the like) includes a silicon substrate and an emitter layer on a side of the silicon substrate. The emitter layer is formed to have a dopant level such that it has a sheet resistance of at least 90 ohms/sq (e.g., 90 to 170 ohm/sq). For example, phosphorous may be diffused into the silicon substrate at a maximum dopant level that is less than about $3\times10^{21}$ cm$^{-3}$.

The PV device further includes an anti-reflection (AR) surface on the emitter layer made up of black silicon. The nanostructures of the black silicon (such as tunnels or pores) may be formed in a manner that does not result in gold or another high-recombination metal being left in the black silicon. For example, metal-assisted etching with a non-high-recombination metal, such as silver, may be utilized to limit later recombination issues. The etching may provide pores with a lateral dimension of about 50 nanometers. Further processing may be performed to widen these pores so as to provide lateral dimensions in the black silicon in the range of 65 to 200 nanometers (note, though, if the structures are columns, pillars, or wires these lateral structures (or structural) dimensions would be the base diameter provided in initial formation and further processing would not be performed as etching may undesirably reduce their scale). The photovoltaic device may be a solar cell that further includes a passivation layer over the antireflective surface, a back electrical contact on a side of the silicon substrate opposite the side with the emitter layer, and a front electrical contact abutting the black silicon emitter layer directly or through any passivation layer that may be applied. The photovoltaic cell may also be a bifacial solar cell transparent to infrared wavelengths.

In addition to the exemplary aspects and embodiments described above, further aspects and embodiments will become apparent by reference to the drawings and by study of the following descriptions.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

DESCRIPTION

Figure 1:
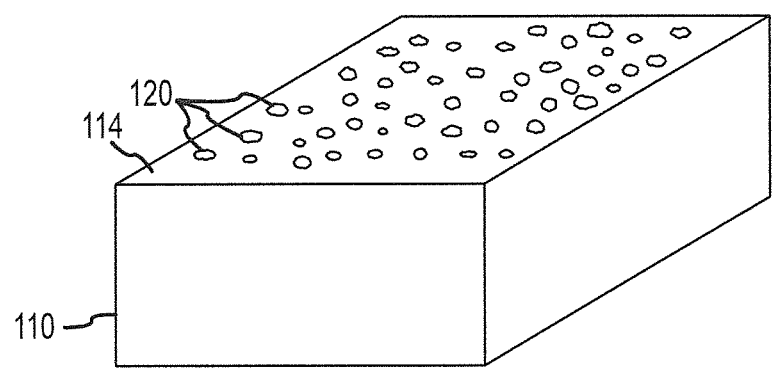
FIG. 1 illustrates a perspective view (not to scale) of a silicon wafer or substrate after deposition or decorating of a surface with metal particles for use in metal-assisted etching.

The following description is directed generally to highly efficient photovoltaic (PV) devices and methods of fabricating such devices. The PV devices each include a silicon wafer or substrate with nanostructures or black silicon providing anti-reflection, and the emitter formed on the silicon substrate (including the black silicon layer) is processed or formed to present a smaller amount of highly doped material and often in a manner that allows the black silicon to be free of gold or other high-recombination metals (or too high of levels/content amounts of such metals). The PV devices may, for example, take the form of an efficient and cost effective silicon solar cell with anti-reflection provided entirely by a layer or surface that is nanostructured to a random depth, e.g., black silicon without use of any conventional interference-based AR coating.

In one particular implementation, a nanostructured, mono-crystalline silicon solar cell is built up from a 300 micrometer-thick wafer with a p-type base. However, the techniques and PV device designs described herein are not limited to such a wafer, and they can be used for mono-crystalline and also multi-crystalline silicon wafers or films having thicknesses ranging from 2 to 300 micrometers with p-type or n-type bases, and the anti-reflection of the PV device (e.g., solar cell, detectors, or the like) may be provided by random-depth/height or black silicon nanostructures (e.g., depth when referring to holes/tunnels and height when referring to columns, pillars, or wires). The PV devices in any of these implementations will be more efficient in the shorter wavelength range (such as below 700 nm), which may be useful in making more efficient solar cells, fabricating detectors that are more sensitive to blue light, and so on.

In creating the presently described designs and fabrication methods, it was recognized that the limited performance of prior black silicon solar cells was likely due to poor spectral response at short wavelengths. For example, a solar cell design that utilized black silicon, with lateral dimensions of less than about 60 nm, for anti-reflection obtained about 16.8 percent efficiency but had only 30 percent internal quantum efficiency (IQE) for 400 nm wavelength light. It is likely for this and many other lower efficiency black silicon solar cells that increased carrier recombination rates in the nanostructured or black silicon layer reduced the short wavelength or blue response of the solar cells. This may be due to several causes including: (a) increased surface area; (b) an extremely doped emitter with extended surface area; and (c) during the nanostructure or black silicon formation process, incorporation of deleterious metals in the black silicon layer and/or emitter that may act as strong recombination centers.

To this end, the PV devices and methods for fabricating these devices address each of these causes for reduced blue response to provide improved PV devices. First, the highly doped region of the PV device is reduced so as to reduce Auger recombination, with the emitter with the black silicon layer being fabricated to provide a sheet resistance of about 90 to 170 ohm/sq. Second, the nanostructures are formed so as to have feature sizes of about 65 to 200 nm (e.g., 65 to 150 nm) so as to reduce surface area. Third, the black silicon is fabricated or processed so as to be substantially free of high recombination metals such as gold. Hence, the PV devices may be a combination of two or more of these design parameters that enhance efficiency, e.g., ideally-sized nanostructures, low doping in the emitter, use of silver rather than gold in forming the black silicon, or the like. In the following discussion, each of these features or aspects of the PV structure design are described in more detail with reference to the figures and fabrication of an exemplary PV device in the form of a black silicon solar cell (see solar cell 560 of FIG. 5, for example).

As discussed, it may be desirable to fabricate or provide the black silicon so that it has lateral feature sizes of 65 to 200 nm (e.g., 65 to 150 nm or the like). The nanostructures may be holes or tunnels such that these dimensions relate to pore size or may be pillars, columns, or wires such that these dimensions relate to an outer diameter of the base of the pillars/columns/wires. It is likely that such larger feature sizes provide a more efficient PV device as the nanostructured silicon is still effective in providing anti-reflection functionality but with reduced (or even minimized) surface area available for undesirable recombination.

In one implementation, the nanostructure of silicon (i.e., the black Si) is folioed in part with an initial chemical treatment called metal-assisted etching. Such etching is liquid-based and is extremely inexpensive to implement, which makes metal-assisted etching useful for forming the black silicon in a PV device so as to provide excellent quality at lower costs compared to application of conventional AR coatings. Metal-assisted etching of the silicon may proceed first by forming metal nanoparticles in-situ or forming or acquiring nanoparticles formed ex-situ that will catalyze the oxidation of silicon. FIG. 1 illustrates a silicon wafer or substrate 110 with an upper surface 114 for use as a light receiving surface of a PV device. For example, the substrate 110 may take the form of a 300 micrometer-thick wafer or the like with a p-base or n-base. As shown, a plurality of metal nanoparticles, metal flakes, or metal islands 120 have been deposited upon or formed in liquid and then reached the surface 114 or formed upon the surface 114 of the substrate 110 during black silicon etching. During etching, holes or tunnels will be formed at these locations to a random depth or to a particular depth determined by the etch chemistry and time.

The metal nanoparticles 120 may be formed of gold, silver, palladium, platinum, copper, or another metal, and the particles 120 may be formed as shown in FIG. 1 on the silicon substrate 110 by any of a number of methods such as physical vapor deposition, evaporation, electroless deposition, in-situ formation of colloidal catalyst in an etching solution, and the like. Etching solutions may include, but are not limited to, a mixture of oxidant (e.g., hydrogen peroxide ($H_2O_2$)), hydrogen fluoride (HF), and water. The metal-assisted etching involves the metal nanoparticles 120 catalyzing the oxidation of the silicon on surface 114 with an oxidant such as $H_2O_2$. In one embodiment, electroless deposition was used to form silver nanoparticles 120 shown in FIG. 1 on the substrate 110 because silver impurities in silicon do not cause excessive recombination of photocarriers. Then, the silicon substrates 110 decorated with silver particles 120 is immersed in an etching solution of HF $H_2O_2$ and water, but, of course, many other combinations and concentrations of oxidants and other etching solution components may be used to cause the etching of the substrate 110 using metal-assisted or another type of surface etching.

Figure 2:
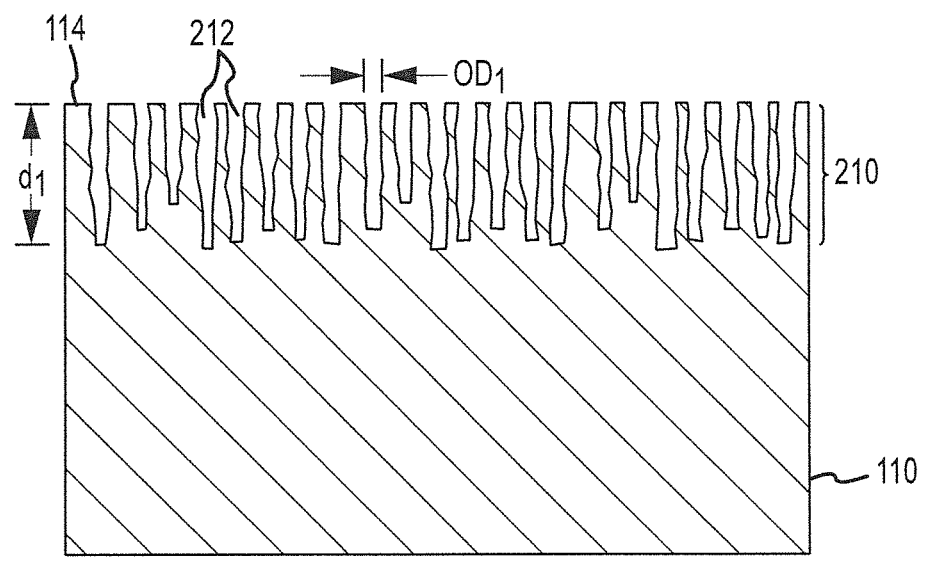
FIG. 2 illustrates a cross sectional view of the silicon substrate of FIG. 1 after metal-assisted etching or other nanostructure forming technique(s) showing a formed nanostructured surface or layer of black silicon.

FIG. 2 illustrates the results of the metal-assisted etching (or initial etching step). As shown, the silicon substrate 110 now includes a light receiving surface 114 with a plurality of nanostructures or a region or layer often termed the black silicon layer 210 because it substantially reduces reflection from the silicon to render it black. The black silicon layer 210 is defined by numerous holes or pores 212 in the surface 114. These pores 212 may have a range of depths, $d_1$, and outer diameters, $OD_1$, which may also be considered the lateral size or dimension of the nanostructures of black silicon region or layer 210. In some cases, the depth, $d_1$, may be 100 to 1000 nm such as about 500 nm or the like while the diameter of the pores 212 after the metal-assisted etching may be about 50 nm or the like, which may be undesirably small in some implementations of PV devices where it is desirable to limit recombination. In one proof-of-concept testing, the maximum pore depth, $d_1$, was about 500 nm on the planar polished surface 114. However, this depth, $d_1$, likely can be provided at 100 to 1000 nm when multi-scale surface texturing concepts (e.g., the usual pyramidal etching with a solution containing KOH or NaOH of the face of silicon or acid-etch texturing of multicrystalline silicon) are adopted for enhanced light trapping.

However, the use of silver in the metal-assisted etching is one useful nanostructure formation process that does not leave high recombination metal atoms in the emitter since silver causes less carrier recombination than most other metals in silicon. This fulfills one of the design parameters discussed above for improving blue or short wavelength response. Any metals used in the formation of the nanostructure have a tendency to getter and segregate into the nanostructured emitter during high temperature emitter and/or passivation steps. While this gettering protects the bulk of the silicon absorber from harmful metal levels, blue response can suffer due to recombination in the black silicon and emitter of a PV device, and, hence, the use of silver is typically preferred over gold (although gold may be acceptable in some implementations) even though such metal-assisted etching is likely to leave traces of silver in the emitter. In addition to silver, other metals, such as palladium, copper, or platinum, may be used in the metal-assisted etching to form the black silicon.

Figure 3:
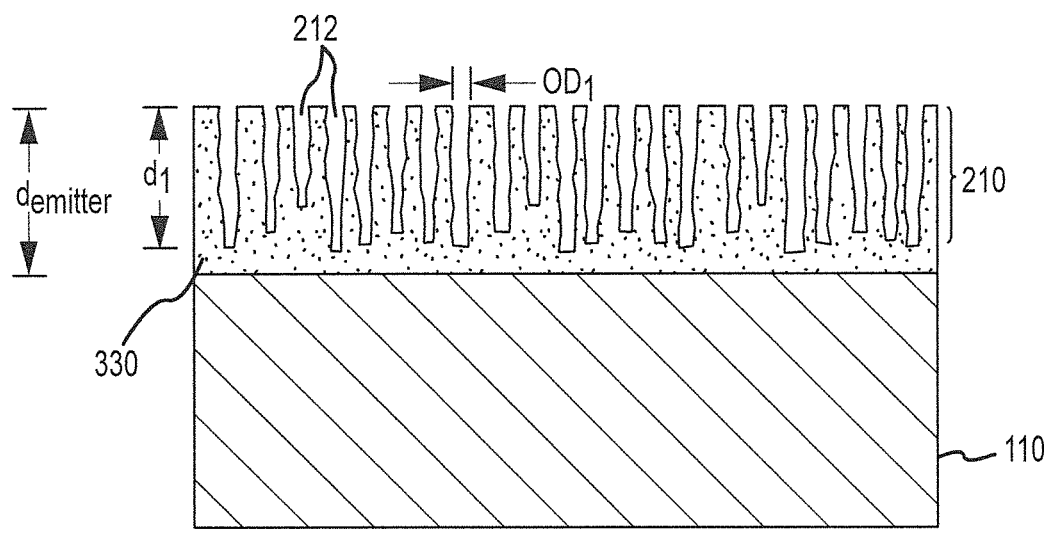
FIG. 3 is a cross sectional view of the substrate of FIG. 2 after doping to form an emitter on the black silicon side of the substrate.

As shown in FIG. 3, an emitter or emitter layer 330 is formed on the substrate 110 in a next processing step. The emitter 330 is formed on the same side as the black silicon layer 210 and typically to a depth, $d_{emitter}$, that is greater than the depth, $d_1$, of the holes/tunnels 212 (e.g., greater than 500 nm or up to 1 or 2 microns). Within the emitter 330 and/or within black silicon layer 210, the blue light or light with shorter wavelengths, such as light with a wavelength less than 700 nm, is absorbed, and this is one reason that control of recombination in this region is useful for improving blue response (or shorter wavelength efficiency) of a cell with the described black silicon/emitter layers.

Formation of the emitter 330 may follow an RCA clean, which is a standard set of silicon wafer cleaning steps used to remove organic contaminants, oxides, and/or metallic contaminants that are performed before high temperature processing steps including diffusion to form the emitter. An emitter 330 may be formed on the substrate 110 on or through the black silicon layer 210, and this may be done through the use of a high temperature diffusing process or other process to provide dopants in the silicon 110 (such as phosphorus, boron, arsenic, gallium, or the like). In one implementation, an n-type emitter 330 is formed on the nanoporous black silicon layer 210 using phosphoryl chloride ($POCl_3$) diffusion processes at higher temperatures (e.g., 850° C. or the like). The phosphosilicate glass (PSG) layer formed during the $POCl_3$ diffusion may be removed, after the diffusion to form the emitter 330, using diluted HF or other techniques. After the formation of emitter 330 and removal of the PSG layer, the dimensions of the black silicon 210 are generally unchanged or only slightly changed, e.g., the average pore diameter, $OD_1$, may still be about 50 nm and the depth, $d_1$, may be about 500 nm (or whatever the original values were after formation of the black silicon layer 210, as shown in FIG. 2).

As discussed above, there are three differing design and/or fabrication parameters that may be followed to enhance the overall efficiency of a PV device with black silicon, and the use of the silver-based metal-assisted etching provided one of these for substrate 110 with emitter 330 and black silicon layer 210 as the emitter 330 is free of gold and other high-recombination metals. Next, though, processes can be performed to provide reduced surface area for recombination in the black silicon layer 210 and also to reduce the amount of highly doped emitter 330.

Figure 4:
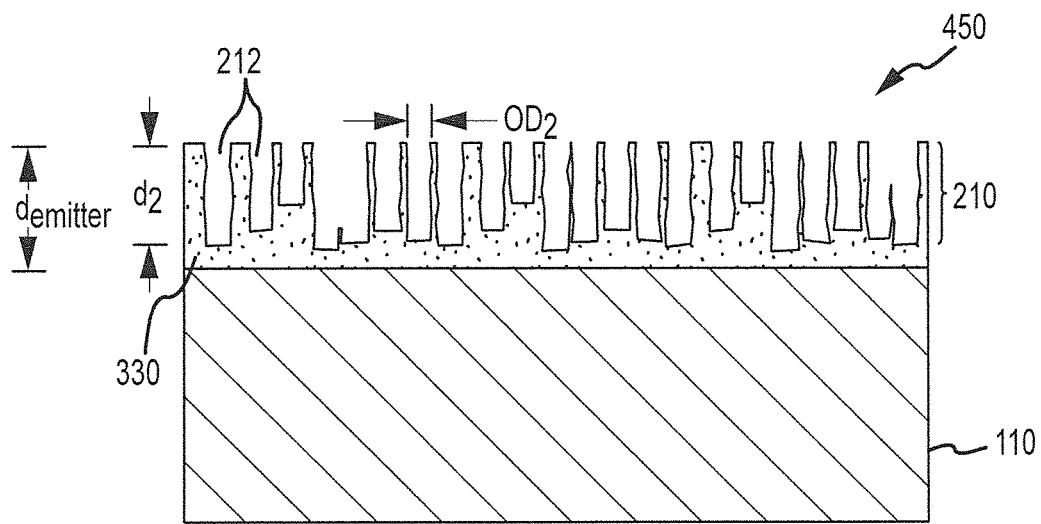
FIG. 4 illustrates a sectional view of a wafer or substrate for use in a photovoltaic device that may be provided by additional processing of the substrate of FIG. 3 to increase the lateral dimensions of the black silicon and reduce doping in the emitter via material removal.

FIG. 4 illustrates a silicon wafer or device 450 that has undergone further processing to provide the features of reduced black silicon surface area and removal of a heavily doped emitter. As shown, the wafer or device 450 includes the substrate 110 in which an emitter 330 has been formed on a light-receiving surface or side. Further, the wafer or device 450 includes a black silicon surface layer 210 for anti-reflection. In contrast to the device of FIG. 3, though, the black silicon layer 210 has been modified in FIG. 4. A volume of material has been removed from the black silicon 210 causing the depth, $d_2$, of the black silicon (or its holes/pores 212) 210 to be decreased (i.e., $d_2 < d_1$, which also reduces the thickness, $d_{emitter}$, of the emitter 330 and removes highly doped silicon. The processing has also widened or increased the average lateral dimensions or sizes of the black silicon structures as shown by an increase in the outer diameter, $OD_2$, of the tunnels/pores 212 such the $OD_2$ is greater than $OD_1$. The processing has also caused the removal of the silicon separating some tunnels/pores 212, which enlarges the tunnels/pores and increases $OD_2$. The fabricated wafer 450 can now be used in nearly any PV device (such as a detector or solar cell) to provide higher efficiency including enhanced shorter wavelength response sometimes below about 700 nm (sometimes simply referred to as blue response).

For effective suppression of reflectance and optimized surface area in the black silicon 210, the pore diameter, $OD_2$, of holes 212 is in the range of 50 to 200 nm (and, more typically, 65 to 150 nm). Similarly, if the black silicon 210 was formed with pillars/columns instead of tunnels/holes 212, the pillars, columns, or wires would have similar lateral dimensions with base diameters of 65 to 150 nm, for example. It is believed that if the lateral dimensions were larger, there would be back-scattered blue or other colors of light that would contribute to reflection to an undesirable extent such that the black silicon 210 would not be as useful in replacing conventional AR coatings. If the lateral dimensions were smaller, there may be too much recombination on the large surface area of the black silicon (such as black silicon shown in FIG. 3 prior to enlargement of the pores 212).

In one implementation of the steps shown in FIGS. 1-4, the 50 nm holes 212 shown in FIG. 3 were increased to pore diameters, OD2, of 65 to 150 nm (with many measured near 100 nm such as 90 to 110 nm) by performing an additional pore widening process. Wet chemistry techniques were used after the formation, by the metal-assisted etch, of the nanoporous silicon 210 shown in FIGS. 2 and 3. Alkaline wet chemistry such as potassium hydroxide (KOH), tetramethyl ammonium hydroxide (TMAH), or other solutions may be used for such pore widening processes (lateral dimension increasing or surface area reduction step(s)) after the metal-assisted etch.

Figure 9:
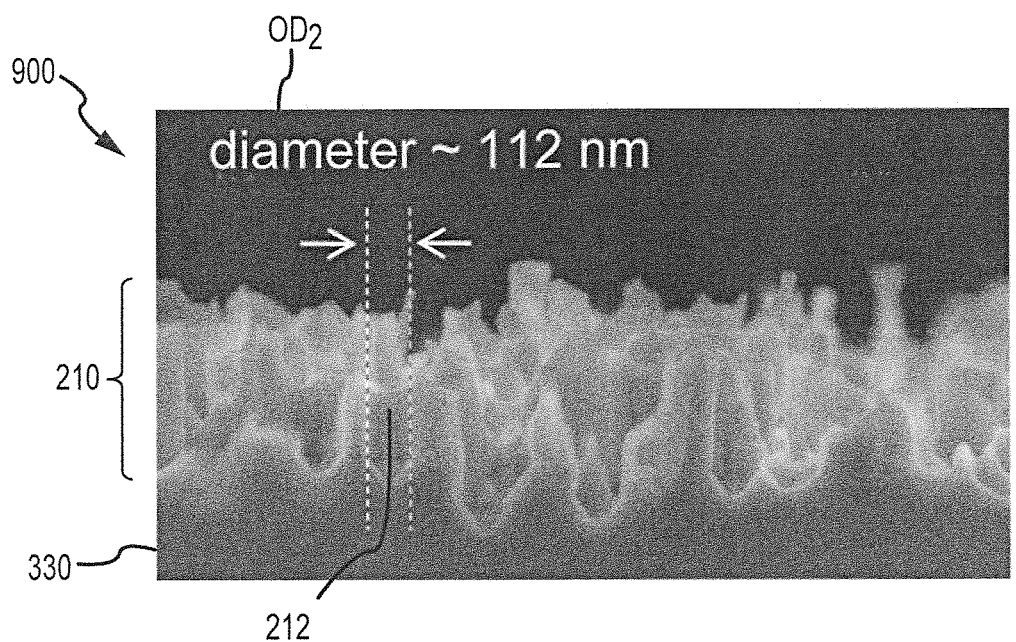
FIG. 9 is an electron micrograph image of one tested implementation of a black silicon wafer or substrate after removal of heavily doped portions of the emitter (e.g., through pore/tunnel widening)

In one particular but non-limiting test implementation, 1% TMAH solution was used to widen the diameter of the pores 212 from about 50 nm into the range of 50 to 200 nm such as 65 nm to 150 nm in some cases. The etching time with this solution was controlled from 0 to 60 seconds at room temperature to obtain pore widening in this range, with more time providing more widening such as holes 212 with $OD_2$ of 100 to 150 nm. The TMAH-based etch was performed after the dopant in-diffusion step. FIG. 9 illustrates an image 900 corresponding with scanning electron micrograph picture of the substrate after the black silicon layer 210 has been subjected to the pore-widening process. As shown with image 900, a measured hole 212 has a diameter, $OD_2$, that is about 112 nm rather than the initial diameter, $OD_1$, of about 50 nm. A range of concentrations of TMAH or other etching solutions such as KOH may be used at a range of temperatures (other than room temperature) to obtain a desired amount of material removal or pore widening. For example, other chemistry such as a mixed solution of hydrogen fluoride (HF), HNO3, and deionized (or DI) water may also be used to widen the pores (and remove emitter material).

In another embodiment, the lateral dimensions of the structures of the black silicon 210 may be controlled in other ways. For example, pillars or columns may be formed initially with the larger base diameters and spacings between neighboring pillars, columns, or wires. In a tunnel/hole example, the pore diameter, $OD_2$, of 65 to 150 nm may be achieved by controlling the size of the metal nanoparticles 120 deposited as shown in FIG. 1. This may be done by controlling the nanoparticle deposition parameters. Specifically, in the case of electroless silver deposition, the size of the silver particles 120 may be controlled by controlling concentrations of silver salt and HF, deposition time, and temperatures. In other cases, the size of the holes/pores 212 in the black silicon layer 210 may be achieved by controlling the etching conditions such as the concentration of the oxidant and HF and/or using differing temperatures. In other cases, the size of the holes/pores 212 in the black silicon layer 210 may be achieved by controlling the etching conditions in the gas phase of a reactive ion etching process.

The control of structure size may be combined with controlling the doping level in the nanostructured portion of the emitter so as to minimize Auger recombination while still providing high open circuit voltage ($V_{oc}$). Auger recombination may occur in the black silicon layer 210 of an emitter 330 shown in FIG. 3, and such recombination deteriorates the spectral response of a PV device that include this wafer/substrate at short wavelengths (e.g., the blue response will be limited). To control Auger recombination, dopant content for the emitter 330 can be controlled such as in $POCl_3$ diffusion as shown with emitter 330 of wafer/device 450 of FIG. 4 in which the very heavily doped portion of the emitter 330 (i.e., a portion of the black silicon layer 210) has been removed.

In some implementations, it was determined that the control of doping in the emitter (or removal of a portion of the highly doped black silicon layer 210) should be performed so as to provide a particular dopant level or profile in the emitter that could then be tested/measured by determining sheet resistance or by measuring dopant concentration and profile by some method (e.g., secondary ion mass spectrometry (SIMS)). For example, a doping profile may be produced in the wafer or substrate comprising the black silicon layer 210 and the doping can be simultaneously monitored with a polished wafer without any nanostructures that accompanies the black silicon wafer through the diffusion furnace and anneal steps. The monitor wafer may have lower dopant concentration than the black silicon layer 210 because of diffusion into all sides of the features within the black silicon layer 210. In other words, a surface with nanostructures can become too heavily doped when compared to a conventional or polished silicon surface, and this should be avoided.

With this in mind, it was determined that doping may be controlled by the diffusion and anneal parameter choices such that the peak concentration of the emitter 330 should be less than about $3 \times 10^{21}$ cm$^{-3}$ but higher than about $10^{18}$ cm$^{-3}$ (as determined by SIMS or another method) and the junction depth, $d_{emitter}$, should not extend more than about 0.6 to 1 micrometer beyond the black silicon layer 210 depth or maximum pore depth. In terms of sheet resistance (which can readily be measured for a fabricated wafer/PV device), a doped emitter on the monitor wafer polished silicon surface may have sheet resistance in the range of 100 to 160 ohm/sq. In one implementation of the wafer/device 450 shown in FIG. 4, the measured sheet resistance of the emitter in the wafer containing the nanostructured black silicon layer 210 was in the range of 90 to 170 ohm/sq, which is very similar to that found in the monitor wafer polished silicon surface. In contrast, the sheet resistance was much lower without doping control such as in the range of 30 to 50 ohm/sq, which indicates the presence of a significant volume of highly doped black silicon that may increase Auger recombination to unacceptable levels (e.g., reduce blue response) in such devices that simply employ black silicon without doping control as taught herein. Note, this may apply to doping with phosphorus or nearly any other dopant such as boron, arsenic, or other dopants used in forming PV devices.

In one implementation, control of the doping in emitter 330 was achieved by removal of a portion of the very heavily doped nanostructured silicon surface 210 as shown between FIGS. 3 and 4 to provide wafer/device 450. For example, doping in the black silicon layer 210 (or emitter 330 which includes region 210) was reduced to the range of $10^{18}$ to $3 \times 10^{21}$ cm$^{-3}$ by use of the TMAH wet chemistry to remove a portion of doped silicon after the emitter formation.

Figure 10:
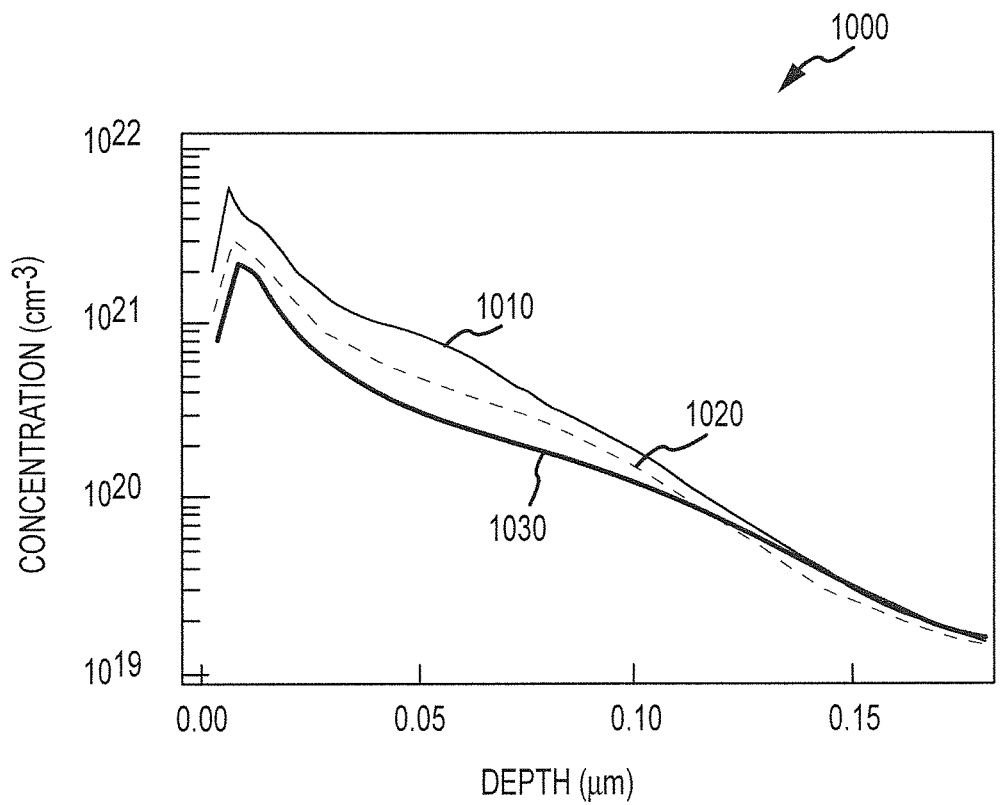
FIG. 10 is a graph showing concentration of dopant before and after etching has been performed to remove portions of the heavily doped emitter material.

FIG. 10 illustrates a graph 1000 in providing concentrations of dopant in the outer portions/surfaces of the emitter 330 before and after widening of pores 212 (e.g., removal of material from black silicon layer 210). As shown, line 1010 corresponds to dopant concentrations in the emitter 330 without any etching, line 1020 corresponds to dopant concentrations in the emitter 330 with TMAH etch for 30 seconds after POCl$_3$ diffusion, and line 1030 corresponds to dopant concentrations in the emitter after TMAH etching for an additional 15 seconds (or 45 seconds total etch time). As can be readily seen from graph 1000, TMAH etching after emitter formation can be effectively utilized to significantly reduce dopant concentration (e.g., phosphorous doping when POCl$_3$ diffusion is used to form emitter 330) such as from about $5 \times 10^{21}$ cm$^{-3}$ to less than about $3 \times 10^{21}$ cm$^{-3}$ in the depths corresponding with the blue response of a photovoltaic device.

However, other etching or material removal techniques may be used and/or the doping levels may be controlled during emitter formation (doping steps). In one implementation, the low-doped emitter 330 is formed with the desired doping profile by controlling doping processes during emitter formation on the nanostructured wafer 110 as shown in FIG. 3. Particularly, an n-type emitter 330 may be formed by POCl$_3$ diffusion processes, and the desired doping can be obtained by controlling process parameters. For example, the POCl$_3$ flow rate, the PSG deposition temperature and time, and/or the phosphorus drive-in temperature and time may be controlled to obtain the desired lower doping in the black silicon layer 210 during formation of the emitter 330. Then, if desired, the lateral size of the black silicon features may be modified such as by widening pores/holes 212 in the black silicon layer 210 as described. Of course, the described techniques are not limited to forming an n-type emitter as the emitter 330 may also be a p-type emitter on an n-base.

After formation of the emitter 330 and any further processing steps (such as pore widening with TMAH or the like), surface passivation with thermal oxidation is typically performed. In this way, any PV device fabricated with the wafer/device 450 would have a surface passivation layer/coating, such as a thermal oxide layer with a thickness of 10 to 70 nm or the like, on the low-doped, nanostructured emitter 330. In other cases, another form of passivation is provided on the surfaces of the black silicon layer 210 for example with Al$_2$O$_3$ (e.g., deposited by atomic layer deposition) or hydrogenated amorphous silicon or silicon nitride or with organic molecules that reduce surface recombination velocity. This passivation layer on the black silicon layer 210 may be provided instead by a wet oxide process or even during some other step of the solar cell formation.

Figure 5:
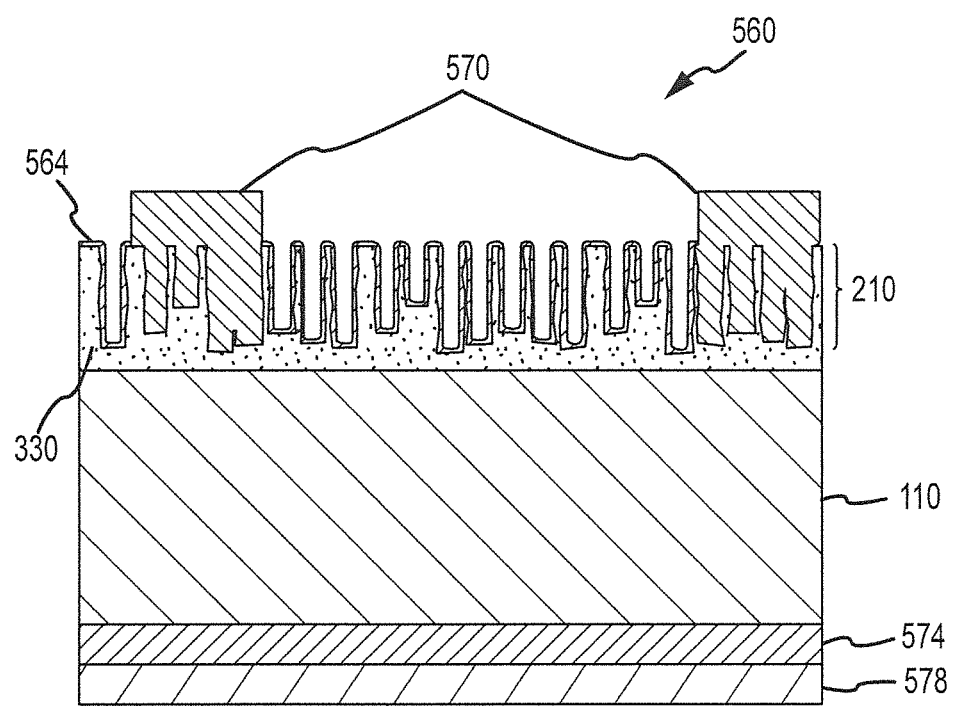
FIG. 5 shows a sectional view of a solar cell fabricated from the wafer or substrate of FIG. 4 providing an exemplary photovoltaic device that can be fabricated using the black silicon/emitter production techniques described herein.

FIG. 5 illustrates a PV device 560 in the form of a solar cell that has been fabricated with the wafer/substrate device 450 of FIG. 4. As shown, a passivation layer or coating 564 has been formed over the black silicon layer 210, and this layer 564 may be a thermal oxide layer as noted above. As shown, the emitter 330 with the black silicon layer 210 (or nanostructured AR surface) is provided on a side of the substrate 110 that may be used as the light-receiving surface for the solar cell 560. A plurality of electrical contacts (e.g., silver or other metal or other highly-conductive contact material) 570 are positioned on the emitter layer 330 in contact with the black silicon 210. The electrical contacts 570 may be positioned so that they make contact not only to the top surface of the silicon but also inside the holes/tunnels 212 to increase the total area of contact and reduce the series resistance of the solar cell 560. These contacts 570 may also be made by screen printing a metal-containing paste that can penetrate the oxide or other passivating layer 564 to contact the emitter layer 330. Such contacts 570 may also provide a highly-doped region beneath the contact to provide the benefits of reduced series resistance provided by the well-known selective emitter contacting approach. The solar cell 560 further includes additional layers/components to provide desired functionality such as a back surface field layer 574 (e.g., a layer heavily doped to the same doping type as the silicon based region 110 by aluminum or boron or other dopant) and a back contact layer 578 (e.g., an aluminum or similar highly-conducting material layer).

In some cases, formation of the solar cell 560 from a textured/etched silicon wafer 450 may involve the following or other processes known to those skilled in the art.

Formation of an emitter 330, after formation of the black silicon layer 210, may involve the diffusion of phosphorus or similar material through the etched surface (e.g., from a spin-on dopant). The doping source may be removed by further etching in concentrated HF or the like, and the result of the diffusion may be the formation of n-type regions. Surface passivation may be provided by oxidizing (e.g., with O$_2$) and annealing (e.g., with N$_2$), which may provide a dry oxide layer 564 with an annealed interface to the black silicon layer 210 to reduce the surface recombination in the black silicon layer 210. A back contact 578 may then be formed by removing the passivating oxide from the back surface of the silicon wafer or substrate 110 and then applying a layer 578 of aluminum or other similar metal onto these back surfaces such as by vacuum evaporation or the like and annealing to form the back surface field layer 574 by diffusion from the back contact 578. Next, a front contract grid 570 may be formed such as by opening an array of slits in the passivating oxide on the front or textured surface side of the wafer/substrate and then covering these slits with Ti or the like such as by vacuum evaporation and lift-off of photoresist. The solar cell 560 may be further processed or be assembled with other cells to make solar modules, which in turn may be linked to form photovoltaic arrays. Of course, this is just one simplified method of fabricating a solar cell, and other techniques may be used to form a solar cell or other PV devices (such as a detector) that includes the wafer/device 450 of FIG. 4.

Figure 6:
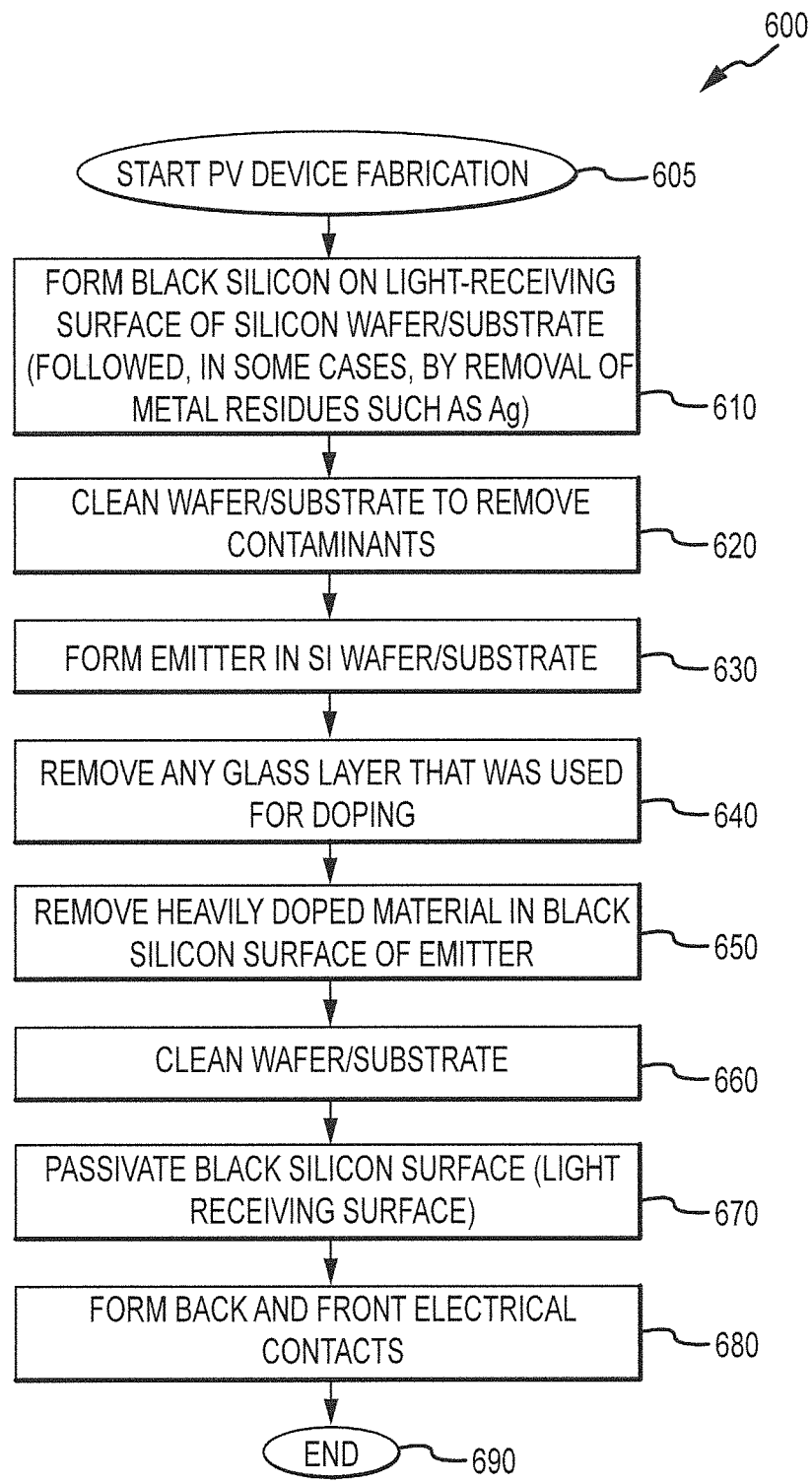
FIG. 6 illustrates a flow diagram of one exemplary method of fabricating a PV device that includes a black silicon surface on a silicon substrate or wafer for anti-reflection and that provides an emitter with controlled doping to enhance blue response.

FIG. 6 illustrates an exemplary method 600 for fabricating a PV device, such as a solar cell or the like, with a black silicon surface providing anti-reflection and configured as described herein with low doping in the emitter, reduced surface area in the black silicon, and, in some cases, black silicon free of high-recombination metals. The method 600 starts at 605 such as with selecting a silicon substrate or wafer for used in the PV device and selection of design parameters such as whether to provide an n-type or p-type emitter, desired doping levels in the emitter (which may be measured via sheet resistance), size of structures in black silicon (e.g., smaller ranges of 65 to 100 nm or larger ranges such as 90 nm to 150 or even 200 nm for lateral dimensions of pores or pillars/columns), and the like.

At 610, the method 600 continues with forming a black silicon layer on a surface to be used as the light-receiving surface for a silicon wafer or substrate. A number of techniques may be used to form or provide a nanostructured (or nanotextured) or black silicon surface on silicon. Herein, black silicon is a surface textured with structures with lateral dimensions less than about 200 nm and depths or heights of less than about 1000 nm depending on whether the structures are holes/tunnels or pillars/columns/wires, and that controls reflectance to less than 7 percent over average solar spectrum (but may be less than 2 percent in some embodiments). In some embodiments, the forming of black silicon at step 610 includes use of metal-assisted etching of the silicon. In one more particular case, the metal-assisted etching can be performed by first depositing silver nanoparticles by electroless deposition and then etching in a mixed solution of $H_2O_2$, HF, and $H_2O$. The resulting pore diameter and depth of the black silicon structures may be about 50 nm and about 500 nm, respectively, using such a technique for step 610. After the black silicon etch 610, metal residues can be substantially removed by a chemical process (as final portion of step 610 or as part of the chemical cleaning 620). For example, metal residues may be removed by etching in concentrated nitric acid ($HNO_3$) when the metal used is silver or in a solution of iodine-potassium iodide ($I_2KI$) when the metal is gold. This pore structure can then be modified later by step 650 that, in addition to removing a volume of heavily doped material, also provided pore widening (e.g., TMAH etching chemistry can be used after emitter formation in step 630). Removal of metal residues may also be combined with the removal step 650.

The method 600 continues at 620 with cleaning the wafer/substrate so as to remove contaminants from the newly-formed black silicon surface/layer. This may involve conventional RCA cleaning as is well-known in the semiconductor industry for cleaning silicon wafers. At step 630, an emitter is formed on the light-receiving surface of the Si wafer or substrate. Again, many techniques may be used to perform step 630 through the black silicon. In one example, an n-type emitter was formed on the nanoporous silicon (formed in step 610) by using $POCl_3$ diffusion at about 850° C. (e.g., with a 8 minute pre-deposition and a 10 minute drive-in).

The method 600 continues at 640 with removal of any glass or other undesirable material from the black silicon surface that may have been formed during doping or emitter formation in step 630. For example, $POCl_3$ diffusion may form a PSG layer, and step 640 is provided to remove the PSG layer such as with diluted HF or the like.

Significantly, the method 600 now includes a step 650 to remove a volume of heavily doped material from the outer surfaces of the black silicon of the emitter. This step may also provide desirable pore widening that is useful in controlling the size of the structures or features of the black silicon to limit surface area available for recombination (e.g., reduce surface area by providing pore diameters of 65 to 200 nm). In one useful example, a 1 percent by volume TMAH solution was used to remove a layer of material that was heavily doped (heavily doped with phosphorous, for example) at or near the surface of the black silicon or nanoporous silicon.

As discussed above, step 650 may also be considered a pore widening step. In this regard, TMAH etching chemistry provides highly controlled silicon etching to reduce the surface area while maintaining the nanoporous structure of the density-graded or black silicon layer 210. For example, the diameter of the nanopores may be increased from 50 nm to about 150 nm, while reflectance increases only about 1 percent after the TMAH treatment (which generally would be an acceptable increase in reflectance). Reduced surface area in the black silicon leads to reduced carrier recombination at the surface of the silicon wafer/substrate and enhanced surface passivation.

Step 650 also controls or lowers doping in the emitter. TMAH treatment after emitter formation etches away (to some depth) a heavily doped top surface of the nanostructured silicon and leads to reduced Auger recombination in the emitter. A secondary ion mass spectrometry (SIMS) on the black silicon treated with TMAH solution confirmed that peak dopant (e.g., phosphorus) concentrations at the top surface decreased to $2.77 \times 10^{21}$ $cm^{-3}$ from $5.77 \times 10^{21}$ $cm^{-3}$ (or from very heavily doped to low (or at least lower) doping in the black silicon). In addition, the total number of dopants per unit area in the porous silicon layer, which was acquired by integrating the doped phosphorous concentration through the junction depth from the SIMS data, was decreased after TMAH treatment more than 40 percent from $1.3 \times 10^{13}$ $cm^{-2}$ to $5.67 \times 10^{12}$ $cm^{-2}$. Removal of heavily doped silicon by TMAH treatment after emitter formation was also confirmed by increased sheet resistance of the doped layer by about 70 percent (e.g., after step 650 is performed sheet resistance of the emitter is preferably in the range of 90 to 150 ohm/sq).

After removal of heavily doped material in step 650, the method 600 may continue with cleaning of the wafer/substrate such as with RCA cleaning procedures to remove organic and inorganic contaminants that may deteriorate the lifetime of the silicon. At step 670, the method 600 continues with passivating the black silicon surface (or the light-receiving surface of the PV device). This may involve thermally growing at a higher temperature (e.g., at about 850° C.) a thin layer of silicon dioxide ($SiO_2$) to passivate the black silicon. The resulting thickness of the $SiO_2$ on the TMAH-treated silicon may vary with one implementation providing about 30 nm $SiO_2$. The decreased thickness of $SiO_2$ (when compared to passivation of a wafer without TMAH treatment) also indicates removal of heavily doped silicon as oxide grows faster on more heavily phosphorous-doped silicon.

The solar device is completed at step 680 with forming back and front electrical contacts on the processed silicon wafer/substrate. This may be achieved in numerous ways to practice the method 600 such as forming back and front contacts with aluminum paste followed by alloying processes and Ti/Ag/Pd metals, respectively, after removing the thermal oxide beneath the metals with diluted HF.

The method 600 ends at 690, and the produced solar cell has reduced surface area and surface doping concentrations in the emitter. As a result, the solar cell properties are greatly improved in various aspects relative to prior black silicon solar cells. For example, the minority carrier lifetime of the silicon wafer with the oxide passivated surface is enhanced by about 300 percent from 64 to 198 microseconds. Further, spectral responses at short wavelengths are greatly improved in the solar cell. For example, internal quantum efficiency or IQE at 400 nm was found to be increased in one solar cell formed by the method 600 from 31 percent (without the step 650) to about 74 percent (after removal of a heavily doped layer found in prior black silicon cells). With this excellent IQE and suppressed reflectance provided by the black silicon, cells have been produced with efficiencies of over 18 percent (e.g., 18.2 percent as confirmed independently by the accredited Measurement and Characterization Group Laboratory at the National Renewable Energy Laboratory), which is a significant improvement over other silicon solar cells with black silicon nanostructures and is comparable to commercial solar cells.

Figure 7:
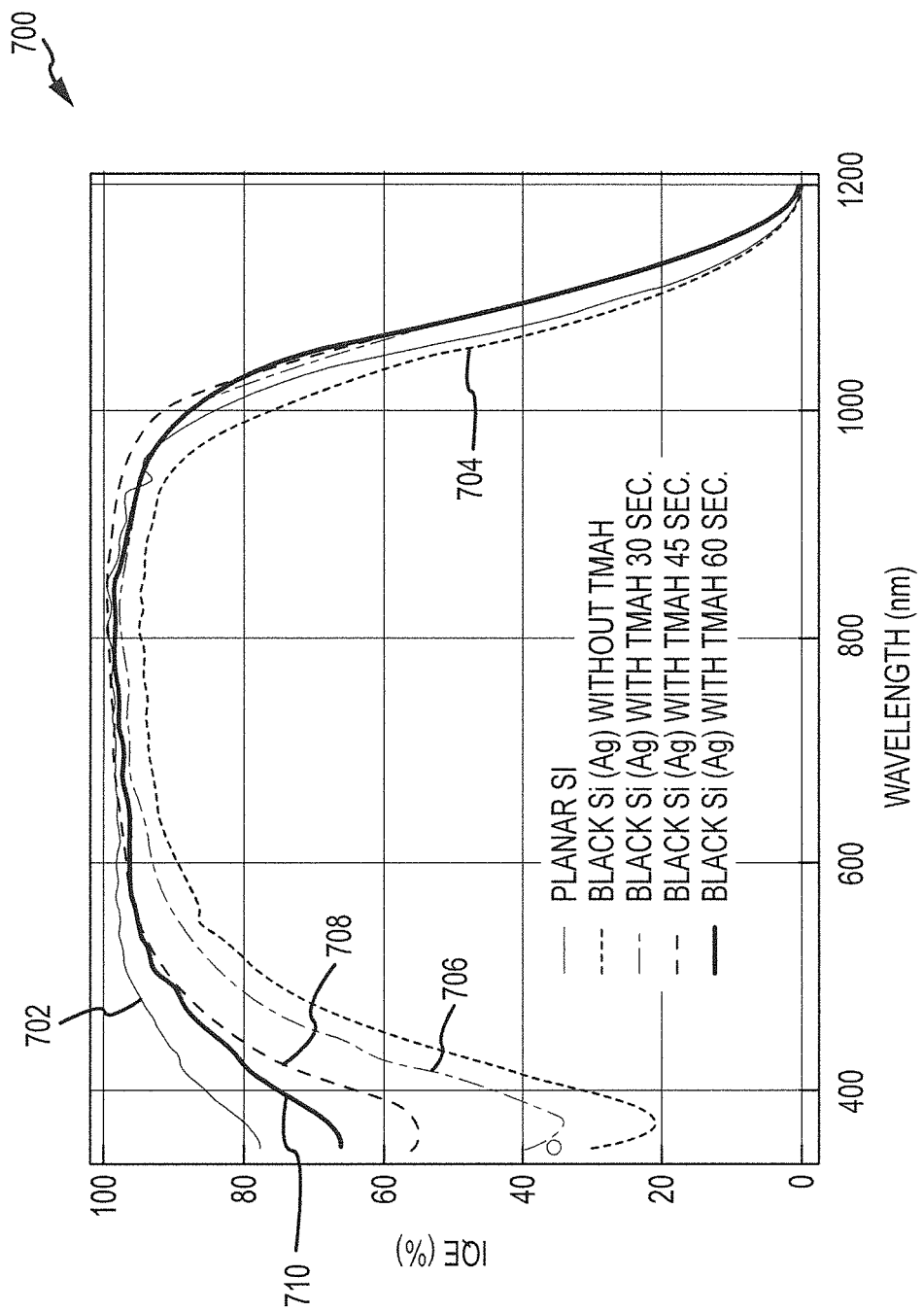
FIG. 7 is a graph of a set of solar cells (or wafers processed for such cells) comparing internal quantum efficiency (IQE) for a range of light wavelengths as a result of a step to remove high doping and/or to reduce surface area (e.g., widen pores/holes of black silicon structures)

FIG. 7 illustrates a graph 700 comparing IQE values for various wavelengths of light for a number of solar cells or silicon wafers processed for use in such cells. As shown with line 702, a planar silicon substrate provides relatively high IQE for light over all wavelengths without deterioration at shorter wavelengths (e.g., those under 700 nm with blue being about 400 nm).

It is believed that poor IQE at short wavelengths (often called or labeled "blue response") originates from increased surface recombination (large surface area), increased Auger recombination (too much heavily doped material in the emitter), and metal impurity in the black silicon/emitter (such as gold impurities). This can be seen with the solar device/wafer represented by line 704 that has a black silicon surface (formed without gold in this case using silver-assisted etching) but has not been treated to reduce doping. As shown with line 704, the black silicon cell without TMAH or other etching to reduce doping and increase pore diameters has relatively poor blue response as shown with a low IQE at 400, with IQE dropping quickly away from the planar Si sample represented by line 702 below 700 nm. High doping was measured for this cell as it had low sheet resistance in the emitter of about 50 ohm/sq that indicates high doping in the emitter.

Line 706 represents a cell in which TMAH etching has been performed for 30 seconds, and, as can be seen, the removal of some heavily doped material from the emitter begins to improve the IQE of the cell at shorter wavelengths. Further etching is provided for the cell represented by line 708 (e.g., TMAH etching performed for 45 seconds), and the removal of additional heavily doped material from the emitter (and black silicon) further enhances the blue response as the IQE has risen to about 60 percent. Line 710 corresponds to one preferred embodiment or implementation of the solar cell produced in which the TMAH was performed for 60 seconds to remove even more heavily doped material from the exposed surfaces of the black silicon (which also widens the pores or increases lateral dimensions of the black silicon structures).

In the cell corresponding to line 710, the sheet resistance in the emitter was measured to be 120 ohm/sq, and the IQE for wavelengths below about 700 nm is approaching that of the planar silicon (e.g., IQE of about 75 percent at 400 nm and about 95 percent at 600 nm). As can be seen, the increased blue response (e.g., to light at wavelengths less than about 700 nm) leads to improvements in the solar cell efficiency. In some useful implementations, the TMAH treated black silicon solar cells have: (1) pore diameters of 65 to 200 nm; (2) reduced surface doping (e.g., sheet resistance in the emitter of 90 to 170 ohm/sq); and (3) no or little high-recombination metal particles (e.g., are formed using silver in a metal-assisted etching process or other gold-free process).

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope. Using the techniques described herein, a nanoporous black silicon solar cell was produced that had excellent spectral response at short wavelengths and that had excellent overall power conversion efficiency of 18.2 percent. This was achieved by reducing the surface area (e.g., lateral dimensions of the black silicon structures of 65 to 150 nm) and by removing the very heavily doped surface or layer of the nanoporous silicon (e.g., using 1 percent by volume TMAH solution) after emitter formation.

Figure 8:
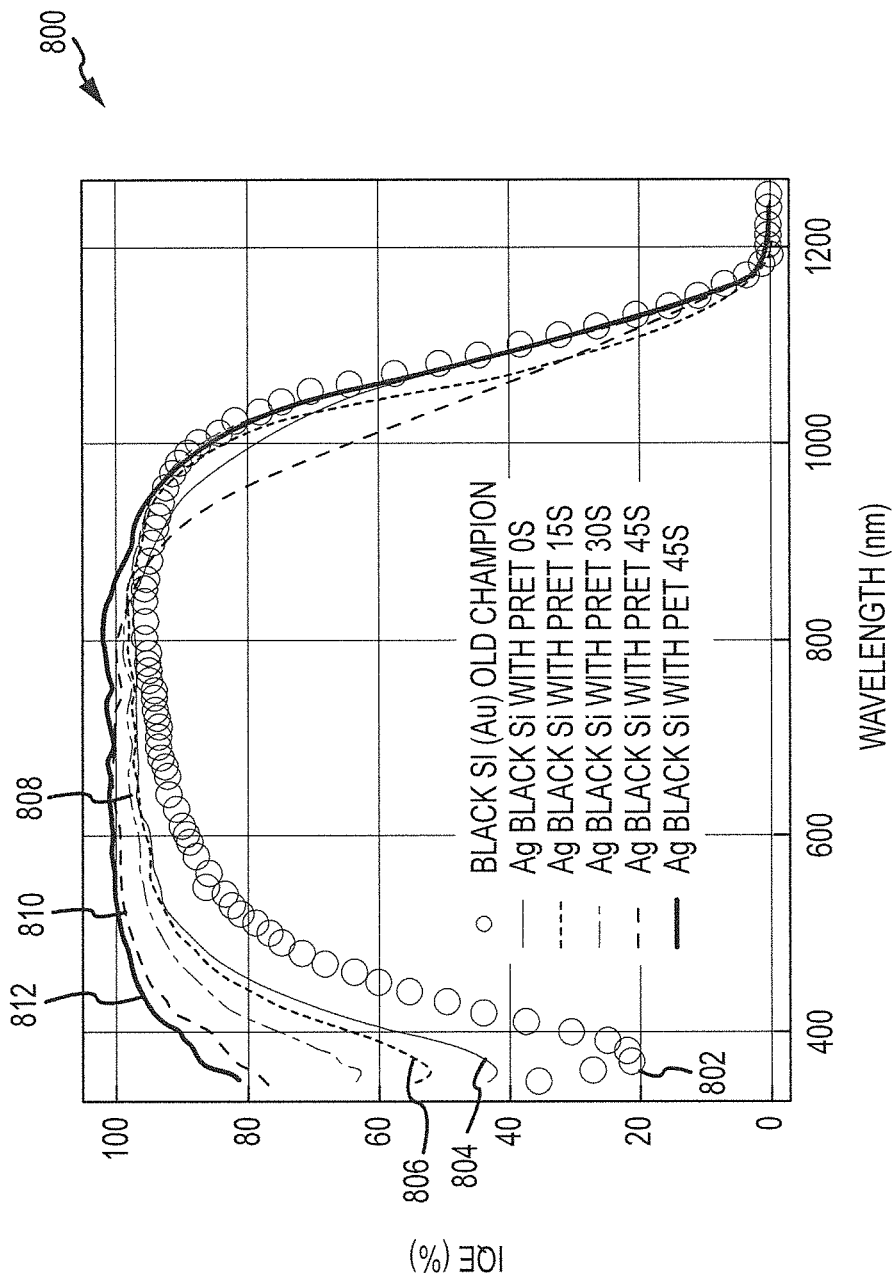
FIG. 8 is a graph of a set of solar cells (or wafers/substrates process for such cells) comparing IQE for a range of wavelengths, with the solar cells being fabricated in an alternative manner to the steps (or order of steps) used to form the cells of FIG. 7.

FIG. 8 is a graph 800 for a set of solar cells (or wafers/substrates process for such cells) comparing IQE for a range of wavelengths, with the solar cells being fabricated in an alternative manner to the steps (or order of steps) used to form the cells of FIG. 7. Line 802 represents the IQE over a range of wavelengths of light for a cell that had been formed using gold in the metal-etching processes and that utilized high doping (and smaller structures such as about 50 nm diameter pores).

In contrast, lines 804-812 provide IQE values over a range of light wavelengths for a number of cells formed using the alternative fabrication process (or at least order of steps) described in the previous paragraphs. Nanostructures silicon is made by silver nanoparticle-assisted black etching followed by TMAH for a period of time to widen pore diameters (this process is labeled PRET in the graph 800). POCl$_3$ doping processes were then performed to form an emitter, and these doping processes were controlled so as to provide dopant levels corresponding to sheet resistances of about 100 ohm/sq.

Line 804 represents a cell for which no pore widening is performed prior to formation of the low dopant-level emitter. As shown, this cell provided improvements over the prior state-of-the-art black silicon cell particularly in the blue response area, which indicates that controlling the dopant in a black silicon cell considered alone (without reducing surface area through pore widening) provides a more efficient solar cell. Line 806 corresponds with a cell for which pore widening is performed for about 15 seconds, and its blue response is improved over the cell associated with line 804 for which no widening was provided. This indicates that reduction in the surface area improves the blue response, and it is desirable for providing a more efficient solar cell.

This point is further clarified with lines 806, 808, and 810 that correspond to cells for which greater and greater amounts of pore widening (or surface reduction) were performed prior to emitter formation. Line 812 represents a cell for which an additional processing step was performed after emitter formation to further reduce doping in the emitter such as a further TMAH etching as discussed above, and this further reduction in doping (which increases sheet resistance above 100 ohm/sq) provides yet further enhancement of the blue response. Hence, it is likely that one skilled in the art will understand that the teachings provided herein may be utilized to achieve even more efficient cells.

In some embodiments, an efficient solar cell is provided with the desired nanostructure and doping levels in the following manner. Black etching is used to fabricate black silicon with the desired nanostructures by optimizing the black etching conditions and/or by following black silicon formation with a process (such as TMAH etching or the like) to widen pores. Then, a controlled $POCL_3$ diffusing or other doping process is used to form the emitter with controlled doping (as may be demonstrated by a measured sheet resistance in the emitter of 90 to 170 ohm/sq).

What is claimed is:

1. A photovoltaic device comprising:
a silicon substrate; and a passivated layer; and
an emitter layer on a side of the silicon substrate, the emitter layer having a dopant concentration of less than $3 \times 10^{21}$ cm$^{-3}$ and a sheet resistance of at least 90 ohms/sq; wherein:
the emitter layer has an antireflective surface comprising black silicon; and
wherein the black silicon consists of pillar structures having a height above the silicon substrate; and the pillar structures have lateral dimensions from 65 to 150 nanometers; and wherein the pillar structures have a density of between $1.1 \times 10^9$ and $5.9 \times 10^9$ per cm$^2$ of the emitter layer; and
wherein a minority carrier lifetime in the photovoltaic device is at least 198 microseconds; and
wherein the emitter layer has a sheet resistance in the range of 90 to 170 ohm/sq.

2. The photovoltaic device of claim 1, wherein the black silicon comprises silver or copper and wherein the silver or the copper is at concentrations less than $10^{19}$ cm$^{-3}$.

3. The photovoltaic device of claim 1, wherein the photovoltaic device is a solar cell further comprising a back electrical contact on a side of the silicon substrate opposite the side with the emitter layer, and a front electrical contact abutting the emitter layer through the passivated layer; and wherein the solar cell has in efficiency of greater than 18 percent.

4. The photovoltaic device of claim 1 comprising an internal quantum efficiency at 400 nanometers of greater than 74 percent and an internal quantum efficiency at 600 nanometers of greater than 95 percent.

5. The photovoltaic device of claim 1, further comprising a front electrical contact that contacts a top surface of the black silicon and extends through a depth of the black silicon to contact lateral sides of the pillar structures of the black silicon.

6. A photovoltaic device comprising:
a silicon wafer with a back surface and a front, light-receiving surface;
a layer of black silicon, on the front, light-receiving surface, comprising a plurality of pillar structures with a height above the silicon wafer and wherein each pillar structure consists of lateral structure dimensions greater than 65 nanometers; and wherein the pillar structures have a density of greater than $5.9 \times 10^9$ per cm$^2$ of the front, light-receiving surface; and
an emitter comprising dopant diffused a depth into the front, light-receiving surface through and beyond the layer of the black silicon, wherein a maximum concentration of the dopant is less than about $3 \times 10^{21}$ cm$^{-3}$; and
wherein a minority carrier lifetime of the photovoltaic device is at least 198 microseconds.

7. The photovoltaic device of claim 6, wherein the layer of black silicon is substantially free of high-recombination metal particles.

8. The photovoltaic device of claim 6, wherein the level of the dopant is in a concentration range such that the emitter has a sheet resistance of 90 to 170 ohm/sq.

9. The photovoltaic device of claim 8, further comprising front contacts on the front, light-receiving surface, wherein a zone underneath the front contacts is doped to a concentration level exceeding the level of dopant in the emitter, whereby the photovoltaic device is a selective emitter black silicon device.

10. The photovoltaic device of claim 6, wherein the pillar structures have a height of less than about 500 nanometers above the silicon wafer.

11. The photovoltaic device of claim 6, wherein the photovoltaic device has an internal quantum efficiency at 400 nanometers of greater than 74 percent.

\* \* \* \* \*